United States Patent
Li et al.

(10) Patent No.: US 11,335,785 B2
(45) Date of Patent: May 17, 2022

(54) METAL OXIDE SEMICONDUCTOR INTEGRATED CIRCUIT BASIC UNIT

(71) Applicant: University of Electronic Science and Technology of China, Chengdu (CN)

(72) Inventors: Ping Li, Chengdu (CN); Yongbo Liao, Chengdu (CN); Chenxi Peng, Chengdu (CN); Yaosen Li, Chengdu (CN); Ruihong Nie, Chengdu (CN); Ke Feng, Chengdu (CN); Xianghe Zeng, Chengdu (CN); Ruifeng Tang, Chengdu (CN); Jiarui Zou, Chengdu (CN); Zhaoxi Hu, Chengdu (CN); Fan Lin, Chengdu (CN)

(73) Assignee: UNIVERSITY OF ELECTRONIC SCIENCE AND TECHNOLOGY OF CHINA, Chengdu (CN)

(*) Notice: Subject to any disclaimer, the term of this patent is extended or adjusted under 35 U.S.C. 154(b) by 0 days.

(21) Appl. No.: 17/126,069

(22) Filed: Dec. 18, 2020

(65) Prior Publication Data
US 2021/0226022 A1 Jul. 22, 2021

(30) Foreign Application Priority Data
Dec. 18, 2019 (CN) .......................... 201911306288.4

(51) Int. Cl.
*H01L 29/02* (2006.01)
*H01L 29/417* (2006.01)
(Continued)

(52) U.S. Cl.
CPC .... *H01L 29/41791* (2013.01); *H01L 29/1608* (2013.01); *H01L 29/2003* (2013.01);
(Continued)

(58) Field of Classification Search
None
See application file for complete search history.

(56) References Cited

U.S. PATENT DOCUMENTS 8,946,670 B1* 2/2015 Park ..................... H01L 29/7813
257/2
2010/0072455 A1* 3/2010 Crowder ................. H01L 29/78
257/9

(Continued)

*Primary Examiner* — Ali Naraghi
(74) *Attorney, Agent, or Firm* — Matthias Scholl P.C.; Matthias Scholl

(57) ABSTRACT

A MOS integrated circuit basic unit includes: a drain semiconductor region; a lightly doped drain region; a channel semiconductor region; a source semiconductor region; a source electrode; a gate electrode; a gate dielectric layer; and a drain electrode. The drain semiconductor region is the bottom of the basic unit. The gate electrode has a ring structure, which surrounds the channel semiconductor region, the source semiconductor region and the lightly doped drain region. The upper surface of the gate electrode is aligned to the upper surface of the source semiconductor region; and a bottom surface of the gate electrode is lower than an interface of the lightly doped drain region and the drain semiconductor region. The gate dielectric layer is disposed between the gate electrode and the adjacent functional layer. The drain semiconductor region is connected to the drain electrode of the basic unit.

5 Claims, 8 Drawing Sheets

(51) Int. Cl.
*H01L 29/16* (2006.01)
*H01L 29/20* (2006.01)
*H01L 29/423* (2006.01)
*H01L 29/66* (2006.01)
*H01L 29/78* (2006.01)
*H02M 7/537* (2006.01)

(52) U.S. Cl.
CPC .. *H01L 29/42356* (2013.01); *H01L 29/66795* (2013.01); *H01L 29/785* (2013.01); *H01L 29/7816* (2013.01); *H02M 7/537* (2013.01)

(56) References Cited

U.S. PATENT DOCUMENTS

| | | | |
|---|---|---|---|
| 2014/0239247 A1* | 8/2014 | Park | H01L 27/2463 257/4 |
| 2015/0262995 A1* | 9/2015 | Huo | H01L 29/0692 257/360 |
| 2015/0310905 A1* | 10/2015 | Karda | G11C 11/2275 365/185.03 |
| 2016/0300886 A1* | 10/2016 | Oh | H01L 29/0847 |

* cited by examiner

METAL OXIDE SEMICONDUCTOR INTEGRATED CIRCUIT BASIC UNIT

CROSS-REFERENCE TO RELATED APPLICATIONS

Pursuant to 35 U.S.C. § 119 and the Paris Convention Treaty, this application claims foreign priority to Chinese Patent Application No. 201911306288.4 filed on Dec. 18, 2019, the contents of which, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, Mass. 02142.

BACKGROUND

Since the birth of Moore's law, the development of the silicon metal oxide semiconductor (MOS) integrated circuit (IC) has followed the rule of scaling down for decades, and the power consumption of silicon IC is decreased with the decrease of the IC operating voltage (Vdd). The pace of Moore's law is slowing down as the feature length (Lf) of the silicon MOS device is becoming smaller and smaller.

The 3-dimensional MOSFET, Fin Field-Effect Transistor (FinFET), was proposed by Prof. Chenming Hu in the year of 2000 for the purpose of solving the problems of the planner MOSFET with a short channel. Nowadays, the FinFET is the main structure of the advanced MOS ICs with mass production. The main feature of the FinFET is that the channel semiconductor region with the fin shape is surrounded by the gate region. The source semiconductor region and drain semiconductor region are on the horizontal direction of the fin. For most of the foundries, the traditional planar MOS began to be replaced by the FinFET at the 20 nm process node. Presently, the mass productions of the 7 nm FinFET ICs have been fully realized. The 5 nm FinFET ICs are on the way of mass production.

However, the further development of the FinFET meets some problems need to be solved as following.

1. In the FinFET, the lightly doped drain semiconductor region called LDD are put on both sides of the channel. The LDDs are used for suppressing the short channel effect and the Drain Induced Barrier Lowering (DIBL) effect. The LDDs of the FinFET are located between the channel region and the heavily doped source region and drain region. The LDDs occupy the chip area, so the level of integration of the MOS IC is limited by the existence of the LDD.

2. When the $L_f$ of IC is decreased, in order to avoid the avalanche breakdown, the electric field density (E) must be lower than the critical electric field density ($E_c$) of the avalanche breakdown. Based on the fact that the E is proportional to $V_{dd}/L_{ch}$, the $V_{dd}$ must be reduced along with the decrease of the $L_{ch}$ for the reason of keeping the E constant. Once the $V_{dd}$ cannot be reduced, the $L_{ch}$ also cannot be decreased. The situation has been reported that the $L_{ch}$ cannot be scaled down with the decrease of $L_f$. The $L_f$ is not equal to the $L_{ch}$. The reports made it clear that in one case of the Intel, when the $L_f$ was 14 nm, the $L_{ch}$ was 20 nm. In another case, when the $L_f$ was 14 nm, the $L_{ch}$ was 33 nm for the TSMC, 30 nm for the Samsung and 24 nm for the Intel respectively. Therefore, the reduction of the area of ICs was limited by the fact that the $L_{ch}$ could not be scaled down. As an additional result, the IC operating frequency ($f_o$) cannot be increased since the $f_o$ is proportional to $1/L_{ch}^2$. So, it is clear that the further development of the Moore's law meets serious trouble that the $L_{ch}$ cannot be scaled down.

3. According to the scaling down rule, as the $L_{ch}$ decreases, the threshold voltage $V_{th}$ should also be reduced. However, according to the formula, $I_{sub} \sim e^{-qVth/(Kt)}$, where the $I_{sub}$ is the sub-threshold current of the MOSFET, when the $V_{th}$ is reduced, the $I_{sub}$ will increase exponentially. Therefore, the $I_{ddq}$ will be exponentially larger since $I_{ddq}$ is proportional to the $I_{sub}$. For example, the $V_{th}$ of a 5 nm FinFET is 0.2V. If following the scaling down rule, the $L_f$ is reduced to 1 nm, then the threshold voltage $V_{th}$ should be scaled down to 0.04V. As a result, the $I_{ddq}$ will be increased 470 times. In this situation, not only that the 0.04V $V_{th}$ is difficult to be controlled, but also that the quiescent power consumption will be very large. So, the $I_{ddq}$ will be the main barrier for the further development of the Moore's law.

4. The operating principle of the FinFET to suppress the DIBL effect is by using the way of the full depletion. The full depletion means that the channel region of a MOSFET is fully depleted by the electronic field in the direction vertical to the channel. So, to fully deplete the channel region, a thinner Fin is helpful. However, the thinner Fin brings about the problem of increasing the difficulty of the fabrication process. The performances of the FinFET device rely on a higher Fin since it is well known that the higher the Fin is, the bigger the channel width will be, as a result, the larger the current of the drain to source ($I_{ds}$) will be. It is difficult to make a high Fin with a small Fin thickness because the Fin may be broken during the fabrication process.

SUMMARY

The disclosure provides a MOS Integrated Circuit Basic Unit, called Hetero-junction Vertical Trench (HVT) MOSFET or called HVTFET.

The basic unit disclosed here has a multilayer structure. From the bottom to the top, the basic unit comprises the drain semiconductor region, the lightly doped drain region, the channel semiconductor region, the source semiconductor region, and the source electrode. The additional regions comprise the gate electrode, the gate dielectric layer, and the drain electrode. The drain semiconductor region is on the bottom. The lightly doped drain region is located in the middle of the upper surface of the drain semiconductor region. The channel semiconductor region is located on the upper surface of the lightly doped drain region, and the four sides of the channel semiconductor region are aligned to the four sides of the lightly doped drain region. The source semiconductor region is located on the upper surface of the channel semiconductor region, and the four sides of the source semiconductor region are aligned to the four sides of the channel semiconductor region. The source electrode is located on the upper surface of the source semiconductor region. The gate electrode has a ring structure, which surrounds the channel semiconductor region, the source semiconductor region and the lightly doped drain region. The upper surface of the gate electrode is aligned to the upper surface of the source semiconductor region and the bottom surface of the gate electrode is lower than the interface of the lightly doped drain region and the drain semiconductor region. There is the gate dielectric layer between the gate electrode and the adjacent functional layer as isolation. The drain semiconductor region is connected to the drain electrode of the basic unit.

In a class of this embodiment, the material of the gate dielectric layer is the $SiO_2$, the $S_{13}N_4$, the $HfO_2$, the $Al_2O_3$ or a combination thereof mentioned.

In a class of this embodiment, the material of the source semiconductor region is the pseudo-crystal SiGe or the polycrystalline SiGe or the polycrystalline germanium or the polycrystalline InP or the polycrystalline HgCdTe, and the material of the channel semiconductor region is the silicon.

In a class of this embodiment, the material of the channel semiconductor region is the SiC or the GaN, and the material of the source semiconductor region is the Si or the Ge.

An inverter based on the MOS integrated circuit basic unit, the inverter comprises two MOS integrated circuit basic units arranged in parallel, which are called the first basic unit and the second basic unit, the characteristics for the first basic unit is that the drain semiconductor region is an $N^+$ type, the lightly doped drain region is an $N^-$ type, the channel semiconductor region is a P type, and the source semiconductor region is an $N^+$ type. While the characteristics for the second basic unit is that the drain semiconductor region is a $P^+$ type, the lightly doped drain region is a $P^-$ type, the channel semiconductor region is an N type, and the source semiconductor region is a $P^+$ type. The gate electrodes of the first basic unit and the second basic unit are integrated as an entity. The first basic unit and the second basic unit share a drain electrode. There is the gate dielectric layer between the gate electrode and the adjacent functional layers.

The beneficial effects of the present disclosure are as following.

The first is to provide a new type of the MOS integrated circuit basic unit to achieve a significant increase in the integration level of the very large-scale IC (VLSI). The key point of the operating principle of the HVTFET is that there is a lightly doped drain region in the vertical direction below the channel semiconductor region. The lightly doped drain region withstands the drain voltage $V_{dd}$. The lightly doped drain region does not occupy the chip area (in contrast, the LDDs of FinFET and GAA occupies the chip area).

The second is to provide a new type of the MOS Integrated Circuit Basic Unit, in which the channel length $L_{ch}$ of the MOSFET is determined by the thickness of the channel semiconductor region. The $L_{ch}$ has no matter with the lithography accuracy. In contrast, in the traditional planner MOSFET, FinFET and GAA, the $L_{ch}$ is defined by the lithography and limited by the lithography accuracy. As a result, for the HVTFET, when the $L_f$ of the chip is reduced, the reduction degree of the $L_{ch}$ can exceed the reduction degree of the $L_f$. In another word, the reduction of the $L_{ch}$ can exceed the scope of the conventional scaling down. Thus, the operating frequency ($f_o$) or the speed of the MOSFET and MOS IC can be greatly improved since the $f_o$ is in direct proportion to $1/L_{ch}^2$. The fact of the $L_{ch}$ of the HVTFET can be reduced individually breaks through the traditional IC reduction rule, namely, the "Scaling down rule" is broken through by the HVTFET.

By using the HVT IC structure, the advanced ICs can be fabricated by using of relatively backward lithography conditions. For example: the 14 nm lithography conditions can be used to manufacture chips with the $L_{ch}$ of 7 nm, 5 nm and 3 nm. The 7 nm lithography conditions can be used to manufacture chips with the $L_{ch}$ of 2 nm, 1 nm and 0.54 nm, etc.

The third, to improve the performance of the analog ICs. The analog ICs often need a relatively high $V_{dd}$, in order to improve the anti-interference ability and improve the signal-to-noise ratio and other parameters. The HVT IC structure can achieve higher $V_{dd}$ by increasing the length of the lightly doped drain region or reducing its doping concentration. For example, for an IC with the 7 nm $L_{ch}$, it can also work normally at $V_{dd}=1.2V$ with a proper design of the lightly doped drain region. Again, the "Scaling down rule" is broken through by that the $V_{dd}$ can maintain at a relatively high level.

The fourth is to make MOS IC have both the high frequency and the high voltage characteristics. For the same reason as the third point above, by adjusting the length of the lightly doped drain region or reducing its doping concentration, the $V_{dd}$ can be increased since the break-down voltage of the drain to source is increased. And doing this provides the conditions for the reduction of the $L_{ch}$. Taking the N HVTFET as an example, when the $N^-$ concentration decreases, more depletion regions are distributed in the n-region, and the P type channel region can be shortened ($L_{ch}$ shortened), therefore, the high voltage and the high frequency can be realized at the same time. According to the operating frequency $f_0 1/L_{ch}^2$, a shorter channel length can effectively improve the high-frequency characteristics.

The fifth is to provide a new method to effectively overcome the DIBL effect of the small-size IC. The structure of the HVTFET can effectively suppress the DIBL effect for a MOSFET with the extremely small $L_{ch}$ (less than 5 nm) and reduce the drain-source leakage current. HVTFET uses a lightly doped drain region (105) whose concentration is much lower than that of the channel region, so that the depletion region of the PN junction mainly extends to the N-drain region, and the barrier shape of the channel region is almost unchanged, thereby the DIBL effect is effectively suppressed.

The sixth is to avoid excessive increase of the IC quiescent leakage current $I_{ccq}$ of the extremely small $L_ch$ (less than 5 nm) MOS. According to the principle of scaling down, as the $L_{ch}$ decreases, the threshold voltage $V_{th}$ also decreases. According to the formula, when the $V_{gs}=0$, $I_{off} \sim e^{-qVth/(KT)}$, the smaller the $V_{th}$ is, the larger the quiescent leakage current of the integrated circuit will be. The threshold voltage of the 5 nm FinFET was as low as about 0.2 V. If the Lf is reduced to 1 nm, the threshold voltage $V_{th}$ should be scaled down to 0.04V, and the quiescent leakage current would increase 470 times. In this case, on the one hand, the threshold voltage $V_{th}$ is difficult to be controlled, on the other hand, the quiescent power consumption will be very large. In the HVT IC, the $V_{dd}$ may not be reduced proportionally, and therefore, the $V_{th}$ may not be reduced proportionally. Therefore, an excessive increase in the quiescent leakage current $I_{ccq}$ can be avoided.

The seventh is the continuation of Moore's Law. As the feature length decreases, the integration level of the HVT IC chips can continue to increase. While the integration level of traditional FinFET and the GAA ICs cannot be improved (due to the scaling down rules, traditional structures cannot solve a series of problems caused by the high field effects), and Moore's Law will stop advancing. Therefore, after the HVT breaks through the constraints of the scaling down rule, Moore's Law can be continued (as the feature length decreases, the IC integration level increases). Therefore, the new reduction rule of the HVT IC will lead IC to move forward in the future.

BRIEF DESCRIPTION OF THE DRAWINGS

In FIG. 1, 101. Gate dielectric layer; 102. Gate electrode; 103. Source semiconductor region; 104. Channel semiconductor region; 105. Lightly doped drain region; 106. Drain semiconductor region; 107. Source electrode; 108. Drain electrode.

DETAILED DESCRIPTION

Example 1

Figure 1:
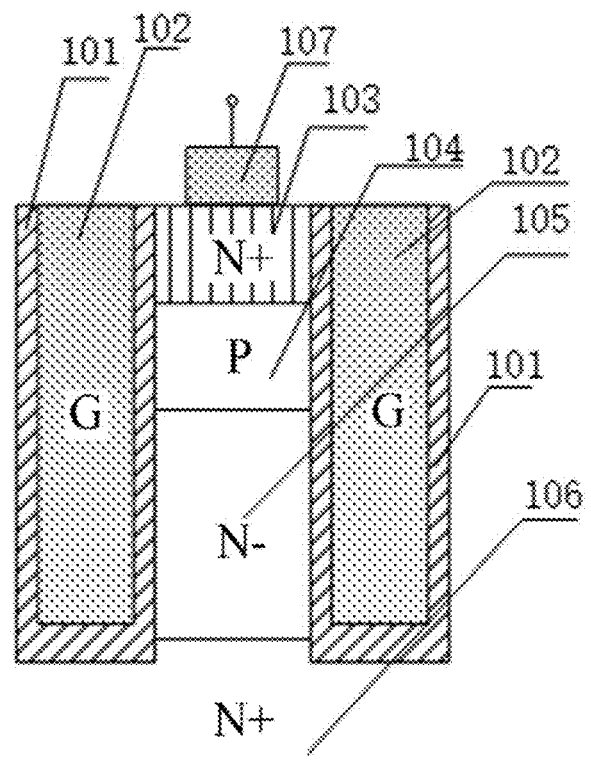
FIG. 1 is a front view of the schematic diagram of the structure of a new type MOS integrated circuit basic unit.
Figure 2:
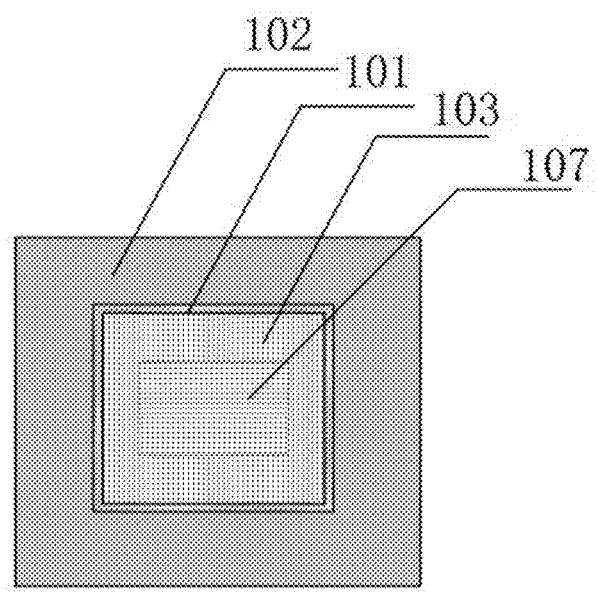
FIG. 2 is a top view of the schematic diagram of the structure of a new type MOS integrated circuit basic unit.

This example simulated the output characteristic curves of the NMOS with the different channel lengths ($L_{ch}$) which were the thicknesses of the channel semiconductor region 104. In this example, the thickness of the channel semiconductor region 104 were 7 nm, 5 nm, and 3 nm, respectively. In the simulations, except for the thickness of the channel semiconductor region 104, the other parameters were the same.

Taking the lateral distance as the width and the vertical distance as the thickness, taking the NMOS with the 7 nm thickness of the channel semiconductor region 104 as an example, the specific parameters of its structure were as follows. The source semiconductor region 103 had a thickness of 10 nm and a width of 10 nm, the material was the SiGe, the doping concentration was $1\times10^{20}$ cm$^{-}$, and the impurity was phosphorus. The channel semiconductor region 104 had a thickness of 7 nm and a width of 10 nm, the material was the silicon, the doping concentration was $5\times10^{19}$ cm$^{-3}$, and the impurity was the boron. The lightly doped drain region 105 had a thickness of 80 nm and a width of 10 nm, the material was the silicon, the doping concentration was $1\times10^{15}$ cm$^{-3}$, and the impurity was the phosphorus. The drain semiconductor region 106 had a thickness of 10 nm and a width of 10 nm, the material was the silicon, and the doping concentration was $1\times10^{30}$ cm$^{-3}$, the impurity was the phosphorus. The gate dielectric layer 101 had a thickness of 2 nm, it wrapped outside the gate electrode 102, and the material was the SiO$_2$. The gate electrode 102 had a thickness of 98 nm and a width of 16 nm, the material was the polysilicon, the doping concentration was $5\times10^{20}$ cm$^{-3}$. The source electrode 107 had a thickness of 15 nm and a width of 9 nm, the material was the titanium.

In the simulation of the 5 nm and 3 nm devices, only the thicknesses of the channel semiconductor region 104 were changed, the other parameters were as same as that of 7 nm. The simulation results were shown in FIG. 3.

Figure 3:
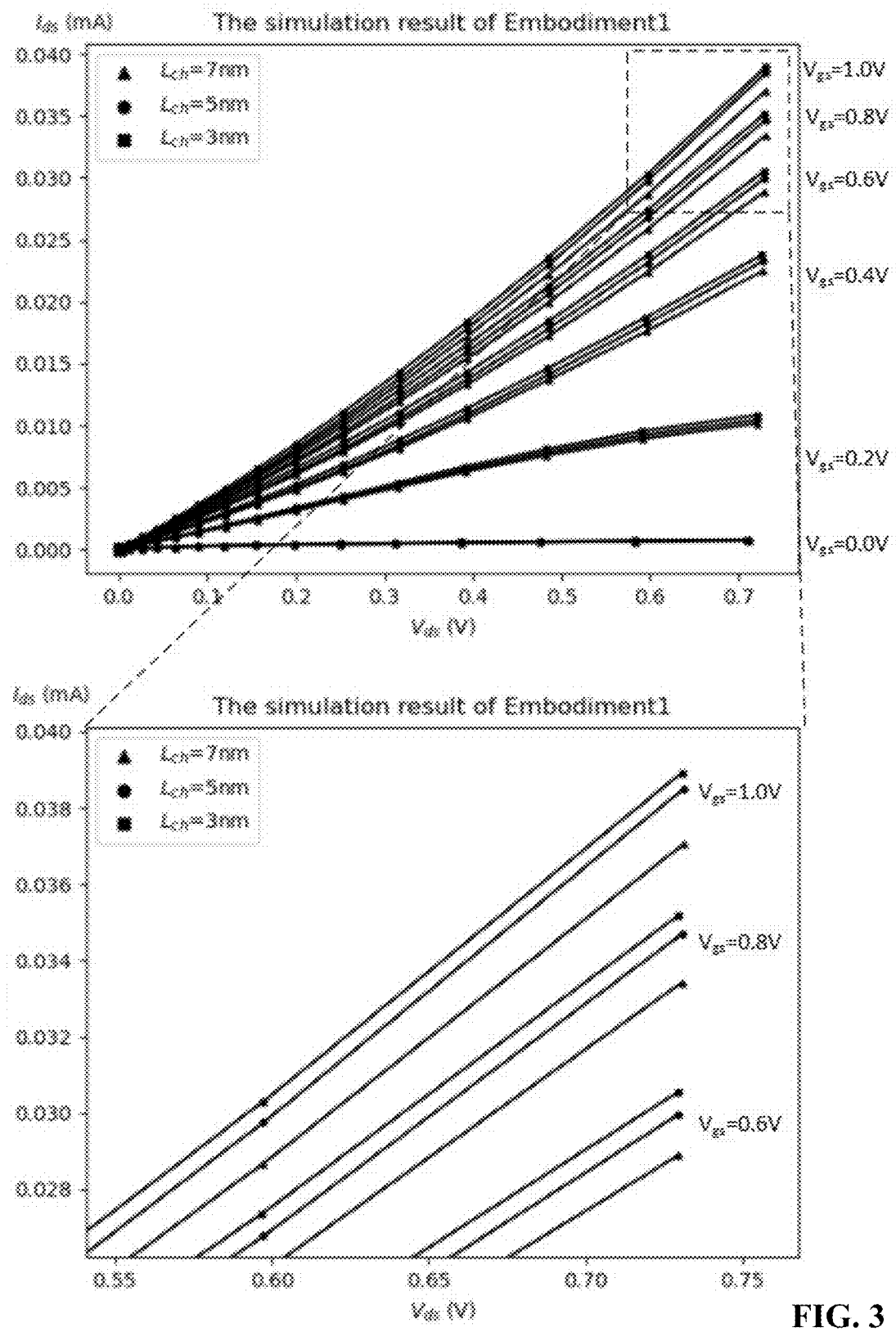
FIG. 3 is the output characteristic curves of the simulation result of the Example 1.

FIG. 3 was the simulation result comprising the output characteristic curves of the 7 nm, 5 nm, and 3 nm devices of the Example 1. It could be seen that the devices worked normally. When the $V_{gs}$=0, the drain currents were almost zero and the maximum trans-conductance was 0.135 mS, 0.141 mS and 0.142 mS for the devices with 7 nm, 5 nm, 3 nm $L_{ch}$ (104) respectively.

Example 2

In this example, except for the $L_{ch}$ (104) were changed to 2 nm, 1 nm, 0.54 nm, respectively, the other parameters were the same as the Example 1.

Figure 4:
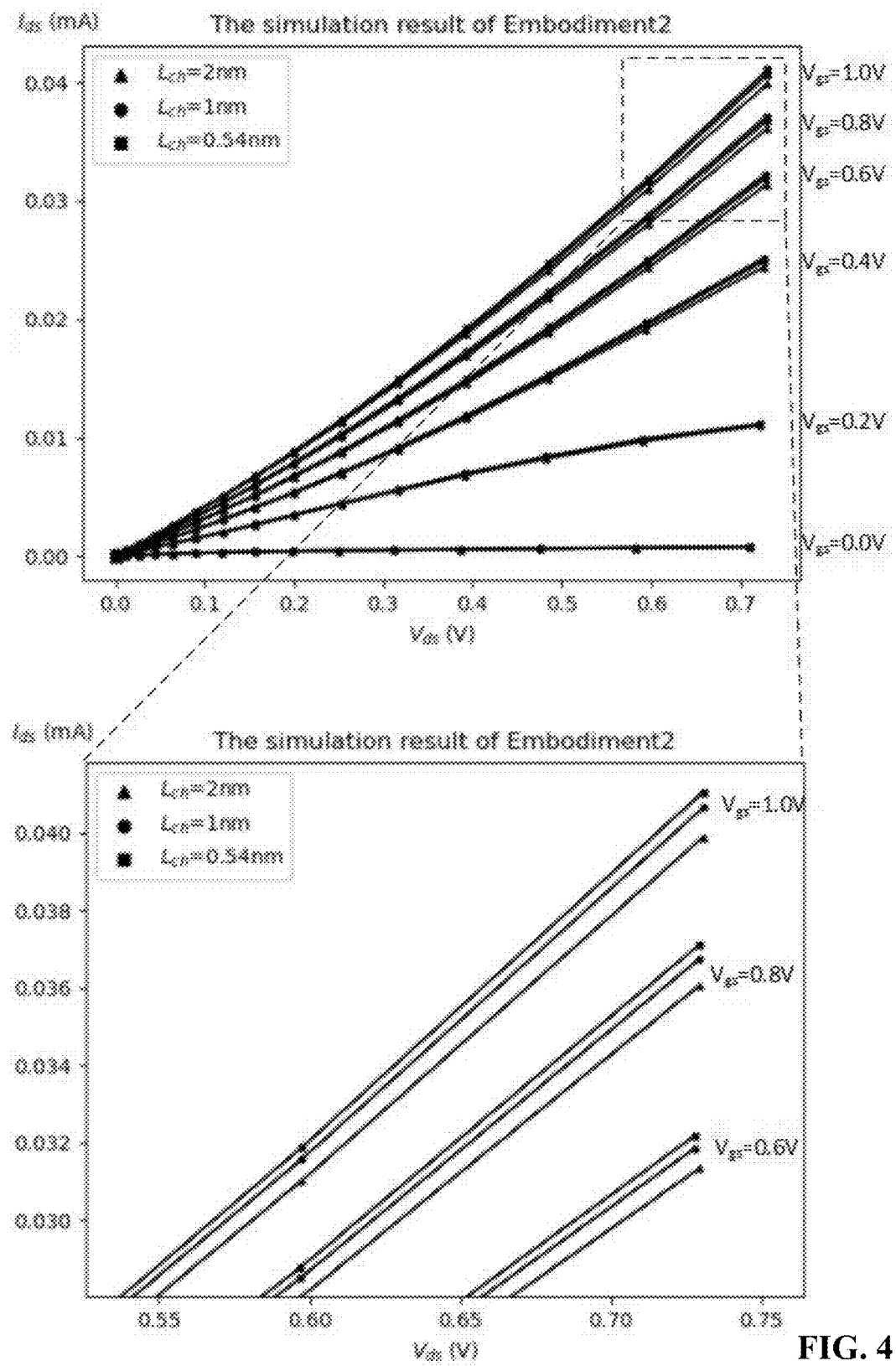
FIG. 4 is the output characteristic curves of the simulation result of the Example 2.

FIG. 4 was the simulation result comprising the output characteristic curves obtained by the Example 2. It could be seen that the devices worked normally. When $V_{gs}$=0, the drain currents were almost zero, and the maximum trans-conductance was 0.146 mS, 0.150 mS and 0.153 mS for the devices with 2 nm, 1 nm, 0.54 nm $L_{ch}$ respectively.

Example 3

The parameters of the structures of the Example 3 were exactly the same as what in the Example 1, except for the thickness of the lightly doped drain region 105 and the channel semiconductor region 104. In this example, the thickness of the channel semiconductor region 104 was 5 nm, and the thicknesses of the lightly doped drain region 105 ($L_{drift}$) were 20 nm, 40 nm, and 80 nm, respectively.

Figure 5:
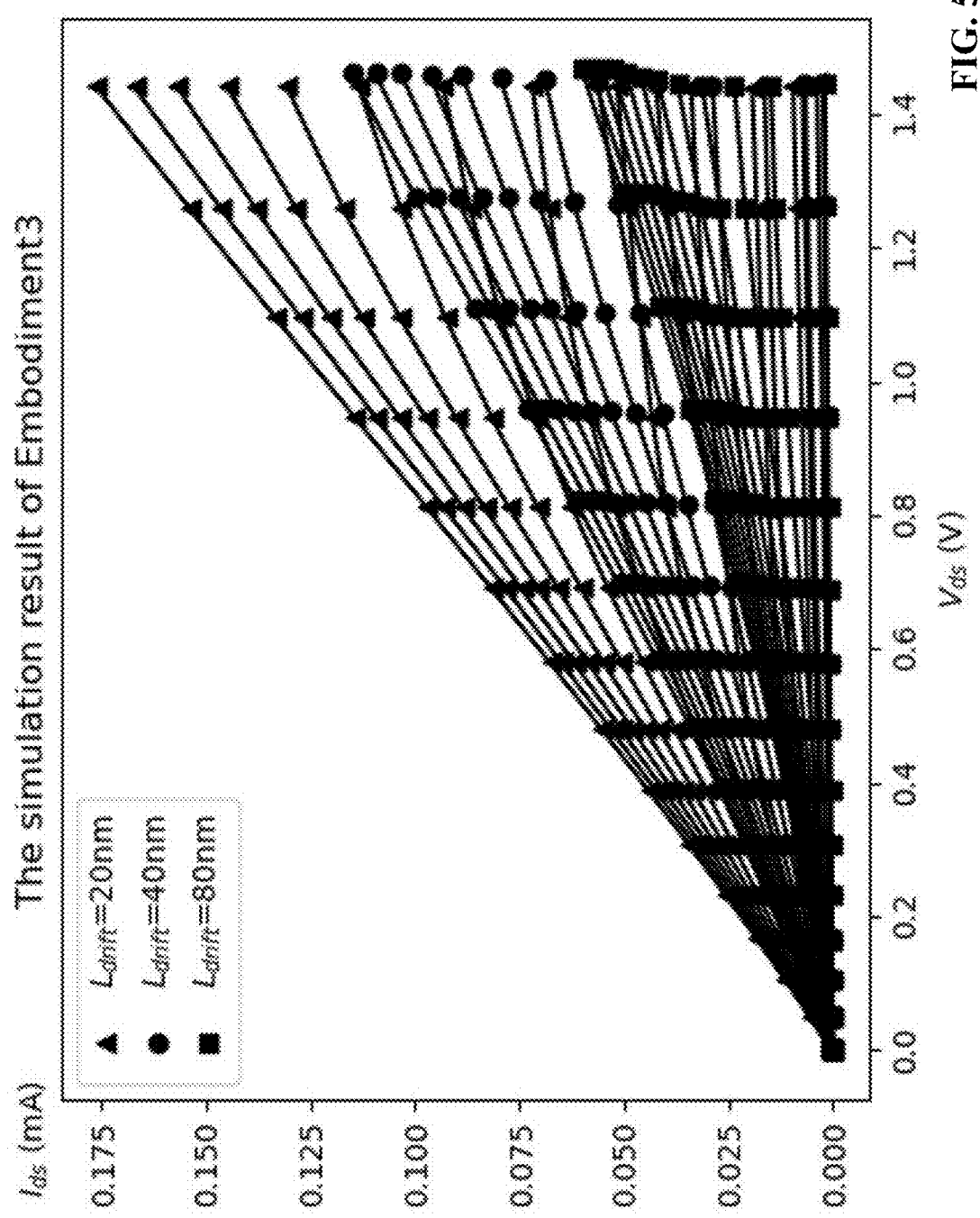
FIG. 5 is the output characteristic curves of the simulation result of the Example 3.

FIG. 5 was the simulation result comprising the output characteristic curves obtained by the Example 3. It could be seen that the devices worked normally and the drain current $I_{ds}$ was increased as the $L_{drift}$ was decreased.

Example 4

In this example, on the basis of the Example 1, the material of gate dielectric layer 101 was changed to the HfO$_2$, the material of the source semiconductor region 103 was changed to the InP. The $L_{ch}$ (104) was 7 nm. The other parameters of the structure of the Example 4 were exactly as same as what in the Example 1.

Figure 6:
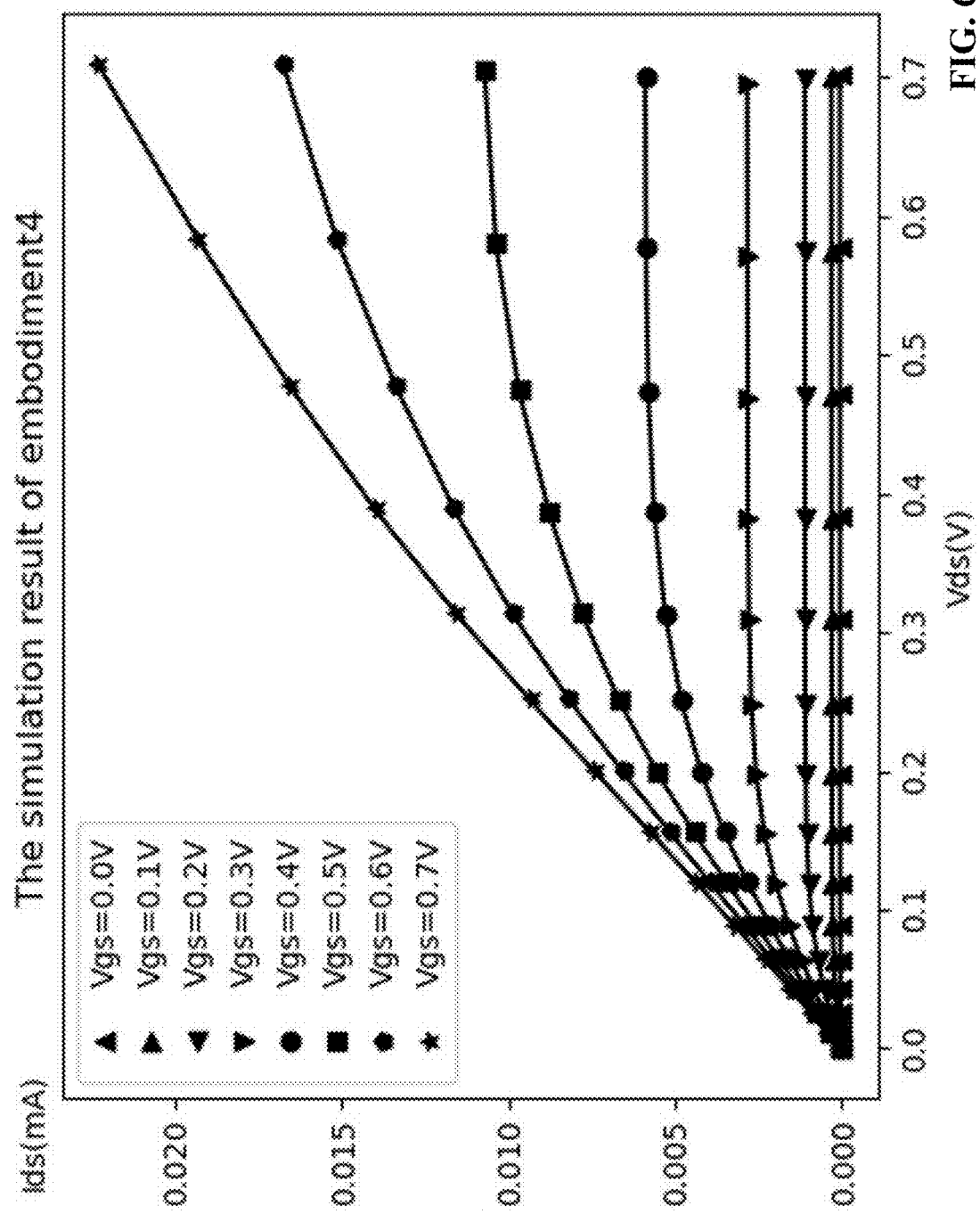
FIG. 6 is the output characteristic curves of the simulation result of the Example 4.

FIG. 6 was the simulation result comprising the output characteristic curves obtained by the Example 4. It could be seen that the device worked normally. It also could be seen that when $V_{gs}$=0, the drain currents were almost zero and the maximum trans-conductance was 115 mS.

Example 5

In this example, on the basis of the Example 1, the thickness of the channel semiconductor region 104 ($L_{ch}$) was 7 nm, the thickness of the lightly doped drain region 105 ($L_{drift}$) was changed to 20 nm, and the operating voltage $V_{dd}$ was increased to 1.2V. The other parameters of the structure of the Example 5 were exactly as same as what in the Example 1.

Figure 7:
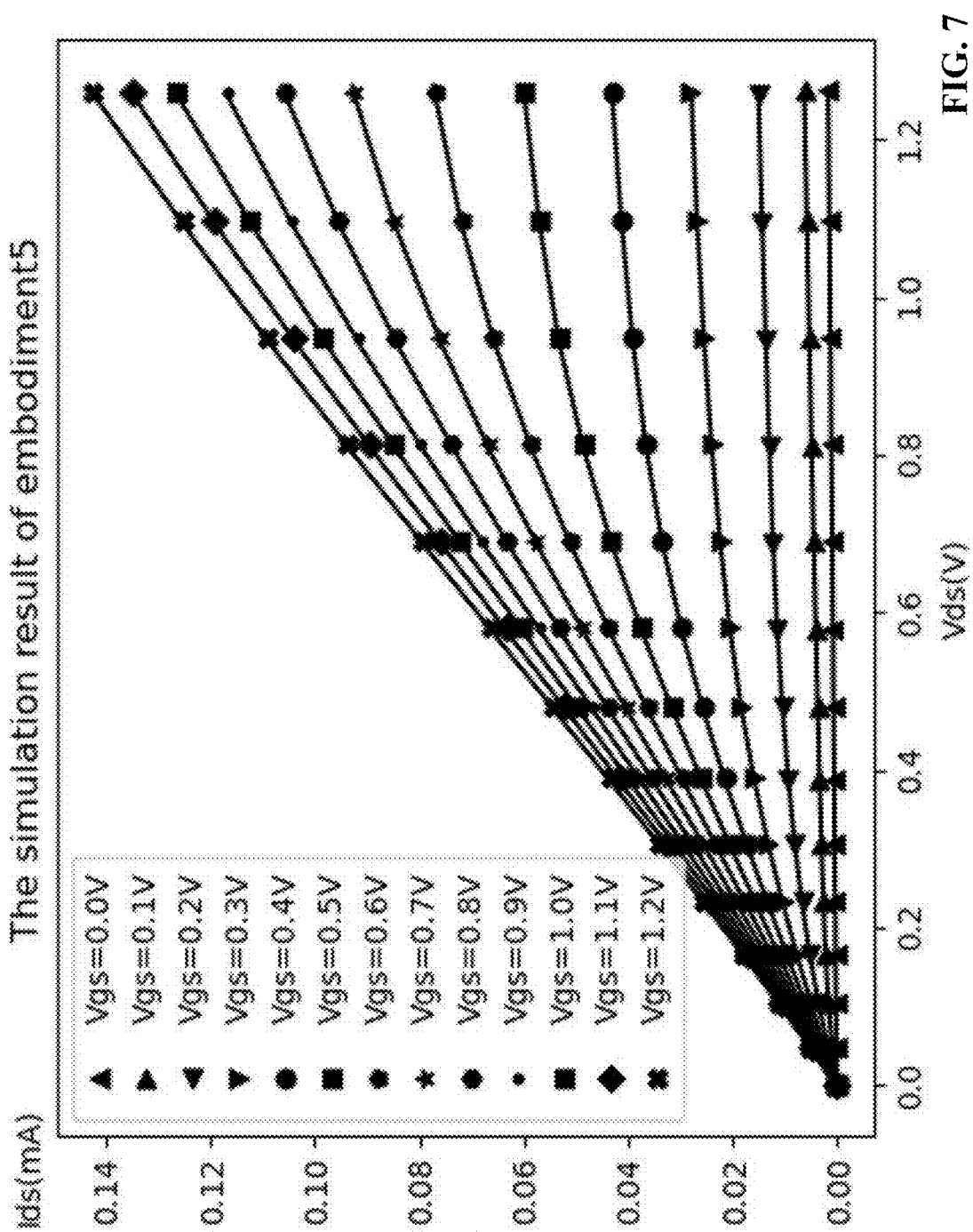
FIG. 7 is the output characteristic curves of the simulation result of the Example 5.
Figure 8:
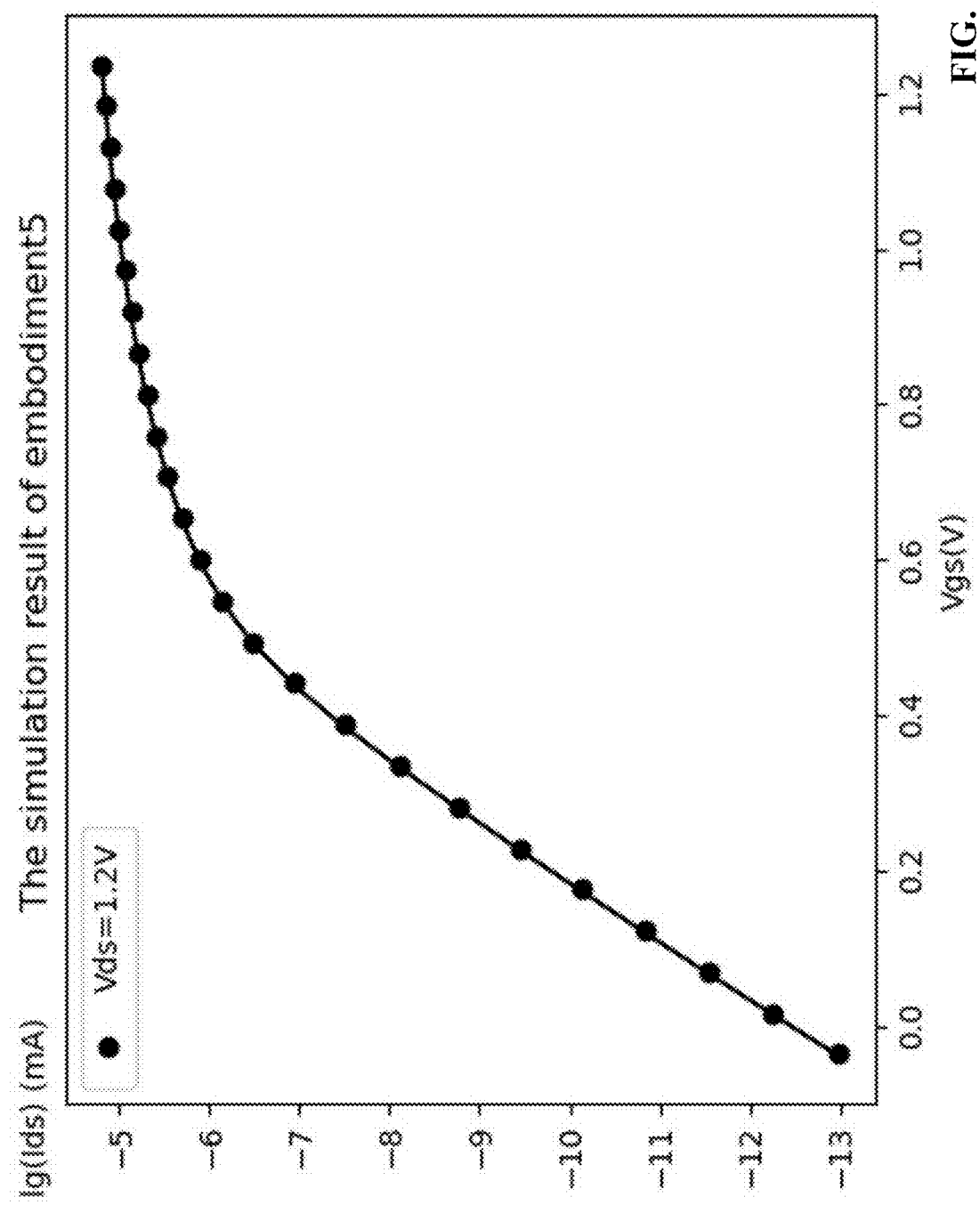
FIG. 8 is the transfer characteristic curves of the simulation result of the Example 5.
Figure 9:
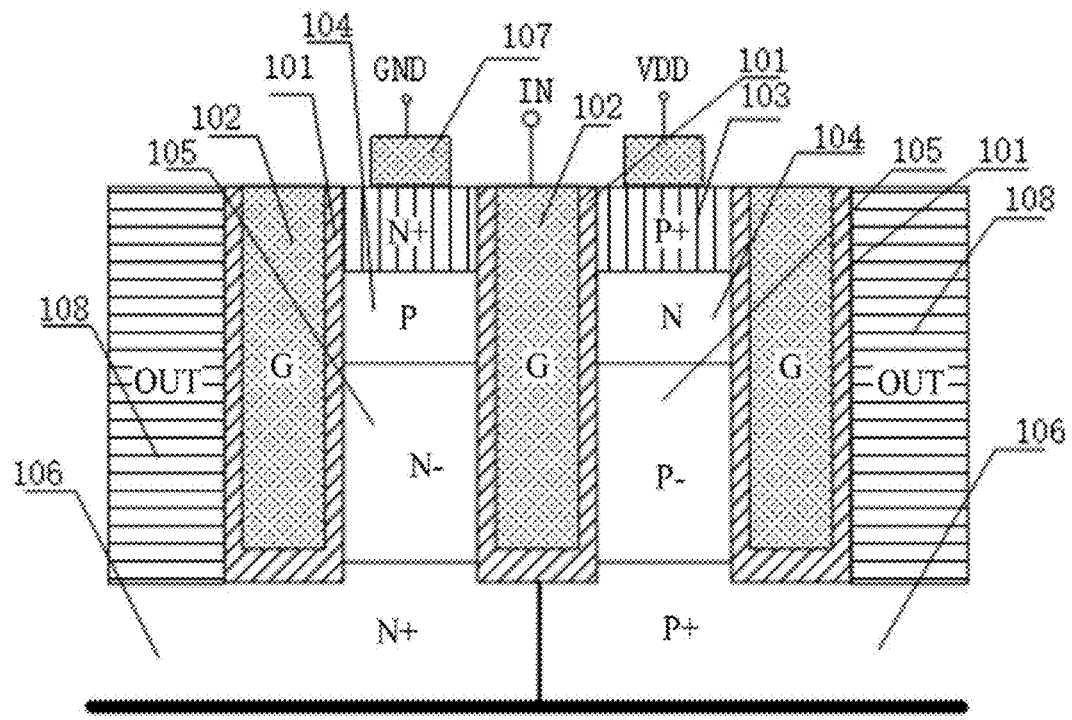
FIG. 9 is a front view of the schematic diagram of the structure of an inverter made of a new type of the MOS Integrated Circuit Basic Unit.
Figure 10:
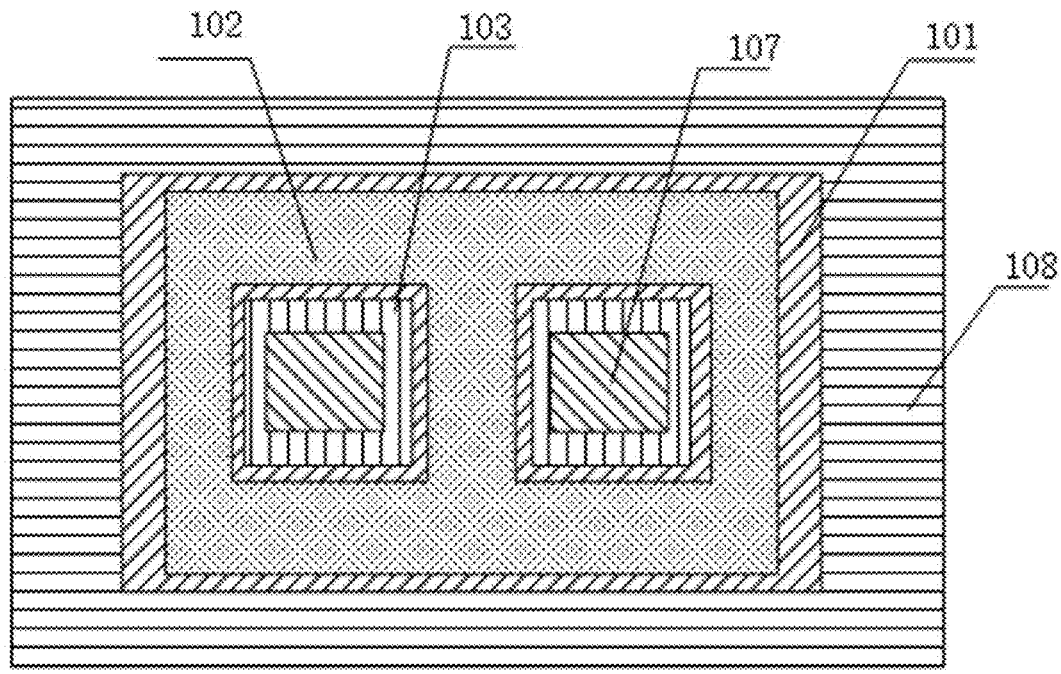
FIG. 10 is a top view of the schematic diagram of the structure of an inverter made of a new type of the MOS Integrated Circuit Basic Unit.

FIG. 7 was the simulation result of the output characteristic curves. FIG. 8 was the simulation result of the transfer characteristic curve. It could be seen that the device worked normally. It also could be seen that in FIG. 7, when $V_{gs}$=0, the drain currents were almost zero and the maximum trans-conductance was 170 mS. In FIG. 8, the ratio of the drain currents when device was on and off Ids(on)/Ids(off) was over $10^8$.

Example 6

In this example, on the basis of the Example 1, the material of gate dielectric layer 101 was changed to the Al$_2$O$_3$, and the material of source semiconductor region 103 was changed to the InP. The other parameters of the structure of the Example 6 were exactly the same as those of the Example 1.

Example 7

In this example, on the basis of the Example 1, the material of the source semiconductor region 103 was changed to the Si, the material of the channel semiconductor region 104 was changed to the SiC. The other parameters of the structure of the Example 7 were exactly the same as those of the Example 1.

Example 8

In this example, on the basis of the Example 1, the material of the source semiconductor region 103 was changed to the Si, and the material of the channel semiconductor region 104 was changed to the GaN. The other parameters of the structure of the Example 8 were exactly the same as those of the Example 1.

Example 9

In this example, a MOS inverter unit was formed based on the device in the Example 1. The inverter comprises two MOS integrated circuit basic units arranged in parallel, which are called the first basic unit and the second basic unit. In the first basic unit, the drain semiconductor region of is an $N^+$ type, the lightly doped drain region is an $N^-$ type, the channel semiconductor region is a P type, and the source semiconductor region is an $N^+$ type. While in the second basic unit, the drain semiconductor region is a $P^+$ type, the lightly doped drain region is a $P^-$ type, the channel semiconductor region is an N type, and the source semiconductor region is a $P^+$type. The gate electrodes 102 of the first basic unit and the second basic unit are integrated as an entity. The first basic unit and the second basic unit share a drain electrode 108. The gate dielectric layer 101 provides the isolation between the gate electrode 102 and the source semiconductor region 103, and the lightly doped drain region 105, and the drain semiconductor region 106. The two MOS integrated circuit basic units had the same sizes and doping concentrations for the corresponding regions. The drain electrode 108 was the drain electrode, the material was the titanium, the width was 10 nm, and the thickness was 100 nm. The source electrode 107 of the first basic unit was connected to the ground GND. The source electrode 107 of the second basic unit was connected to the power supply $V_{dd}$. The gate electrode 102 was the input port. The drain electrode 108 was the output port.

It will be obvious to those skilled in the art that changes and modifications may be made, and therefore, the aim in the appended claims is to cover all such changes and modifications.

What is claimed is:

1. A metal oxide semiconductor (MOS) integrated circuit basic unit, comprising:
a drain semiconductor region;
a lightly doped drain region;
a channel semiconductor region;
a source semiconductor region;
a source electrode;
a gate electrode;
a gate dielectric layer; and
a drain electrode;
wherein:
the drain semiconductor region is a bottom of the basic unit;
the gate electrode has a ring structure, which surrounds the channel semiconductor region, the source semiconductor region and the lightly doped drain region;
an upper surface of the gate electrode is aligned to an upper surface of the source semiconductor region; and a bottom surface of the gate electrode is lower than an interface of the lightly doped drain region and the drain semiconductor region;
the gate dielectric layer is disposed between the gate electrode and an adjacent functional layer;
the gate dielectric layer provides the isolation between the gate electrode and the source region, and the lightly doped drain region, and the drain semiconductor region; and
the drain semiconductor region is connected to the drain electrode of the basic unit.

2. The circuit of claim 1, wherein the gate dielectric layer comprises $SiO_2$, $Si_3N_4$, $HfO_2$, $Al_2O_3$ or a combination thereof.

3. The circuit of claim 1, wherein the source semiconductor region comprises pseudo-crystal SiGe, polycrystalline SiGe, polycrystalline germanium, polycrystalline InP, or polycrystalline HgCdTe; and the channel semiconductor region comprises silicon.

4. The circuit of claim 1, wherein the channel semiconductor region comprises SiC or GaN, and the source semiconductor region comprises Si or Ge.

5. An inverter, comprising two MOS integrated circuit basic units of claim 1 arranged in parallel; wherein:
the two MOS integrated circuit basic units comprise a first basic unit and a second basic unit; in the first basic unit, the drain semiconductor region is an $N^+$ type, the lightly doped drain region is an $N^-$ type, the channel semiconductor region is a P type, and the source semiconductor region is an $N^+$ type;
in the second basic unit, the drain semiconductor region is a $P^+$ type, the lightly doped drain region is a $P^-$ type, the channel semiconductor region is an N type, and the source semiconductor region is a $P^+$ type;
the first basic unit and the second basic unit share a drain electrode;
the gate electrodes of the first basic unit and the second basic unit are integrated as an entity; and
the gate dielectric layer provides the isolation between the gate electrode and the source semiconductor region, and the lightly doped drain region, and the drain semiconductor region.

* * * * *